(12) United States Patent  
Becklin

(10) Patent No.: US 8,152,249 B2
(45) Date of Patent: Apr. 10, 2012

(54) APPARATUS AND METHOD FOR A FLIP RAIL IN A RACK MOUNT

(75) Inventor: Dennis M. Becklin, Grants Pass, OR (US)

(73) Assignee: Enviornmental Container Systems, Inc., Grants Pass, OR (US)

( * ) Notice: Subject to any disclaimer, the term of this patent is extended or adjusted under 35 U.S.C. 154(b) by 388 days.

(21) Appl. No.: 12/141,783

(22) Filed: Jun. 18, 2008

(65) Prior Publication Data

US 2009/0071916 A1 Mar. 19, 2009

Related U.S. Application Data

(60) Provisional application No. 60/944,683, filed on Jun. 18, 2007.

(51) Int. Cl.
*A47B 81/00* (2006.01)
(52) U.S. Cl. ............... 312/223.1; 312/265.1; 312/334.4
(58) Field of Classification Search .... 312/265.1–265.4, 312/223.1, 334.4, 334.5; 211/26, 189
See application file for complete search history.

(56) References Cited

U.S. PATENT DOCUMENTS

| | | | | | |
|---|---|---|---|---|---|
| 3,482,895 | A * | 12/1969 | Becklin | ........................ | 312/352 |
| 4,191,436 | A * | 3/1980 | Cherry | ..................... | 312/334.11 |
| 6,181,549 | B1 * | 1/2001 | Mills et al. | ............... | 361/679.59 |
| 6,297,962 | B1 * | 10/2001 | Johnson et al. | ................ | 361/726 |
| 6,360,900 | B1 * | 3/2002 | Carbonneau et al. | ........... | 211/26 |
| 6,523,918 | B1 * | 2/2003 | Baiza | ........................ | 312/265.1 |
| 6,600,656 | B1 * | 7/2003 | Mori et al. | ..................... | 361/724 |
| 6,609,619 | B2 * | 8/2003 | Abbott | ............................ | 211/26 |
| 6,942,257 | B2 * | 9/2005 | Wong et al. | ..................... | 292/128 |
| 7,277,273 | B2 * | 10/2007 | Smith et al. | .............. | 361/679.01 |
| 7,364,244 | B2 * | 4/2008 | Sandoval | ....................... | 312/333 |
| 7,688,584 | B1 * | 3/2010 | Becklin | ......................... | 361/694 |
| 2008/0135503 | A1 * | 6/2008 | Hidaka | .......................... | 211/26 |
| 2009/0071916 | A1 * | 3/2009 | Becklin | ........................... | 211/26 |
| 2010/0187148 | A1 * | 7/2010 | Becklin | ......................... | 206/521 |

* cited by examiner

*Primary Examiner* — Darnell Jayne
*Assistant Examiner* — Daniel Rohrhoff
(74) *Attorney, Agent, or Firm* — Lowe Graham Jones PLLC

(57) ABSTRACT

Apparatus and method for a flip rail in a rack mount are disclosed herein. A flip rail apparatus for allowing full width electronic equipment to be slide mounted in a rack mount case includes a rack mount frame coupled to a rack mount case. The rack mount frame is configured to hold standard rack mountable electronic equipment. The frame has a first front vertical rail and a second front vertical rail. The first vertical flip rail is attached to the first vertical rail and the second vertical flip rail is attached to the second vertical rail. The first and second vertical flip rails selectively rotate outward away from the electronic equipment in order to allow electronic equipment to be removed.

16 Claims, 4 Drawing Sheets

APPARATUS AND METHOD FOR A FLIP RAIL IN A RACK MOUNT

PRIORITY CLAIM

This application claims the benefit of the filing date of U.S. Provisional Patent Application No. 60/944,683 filed on Jun. 18, 2007, which is herein incorporated by reference in its entirety.

BACKGROUND OF THE INVENTION

Transportation of precision electronic instrumentation generally requires bulky packaging to insulate the instruments from shock or vibration. After use, the instruments must be repacked for shipping. In many circumstances, particularly in military field use, it is desirable that the instruments be as protected as possible during temporary operation. Additionally, when instruments are used intermittently at different locations it is desirable that the instruments be quickly and easily readied for transportation.

A rack mount case provides a sturdy protective shell for installments mounted in a shock and vibration resistant carriage. The case permits installation of rack mount instrument units without modification and permits operation of the units without removal from the case. The electronics are, however, permanently mounted into the case. Prior rack mount cases do not allow for the equipment to be easily removed and placed in a standard rack.

SUMMARY OF THE INVENTION

An apparatus and method for a flip rail in a rack mount are disclosed herein. A flip rail apparatus for allowing full width electronic equipment to be slide mounted in a rack mount case includes a rack mount frame coupled to a rack mount case. The rack mount frame is configured to hold standard rack mountable electronic equipment. The frame has a first front vertical rail and a second front vertical rail. A first vertical flip rail is attached to the first vertical rail and a second vertical flip rail is attached to the second vertical rail. The first and second vertical flip rails selectively rotate outward away from the electronic equipment in order to allow electronic equipment to be removed.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
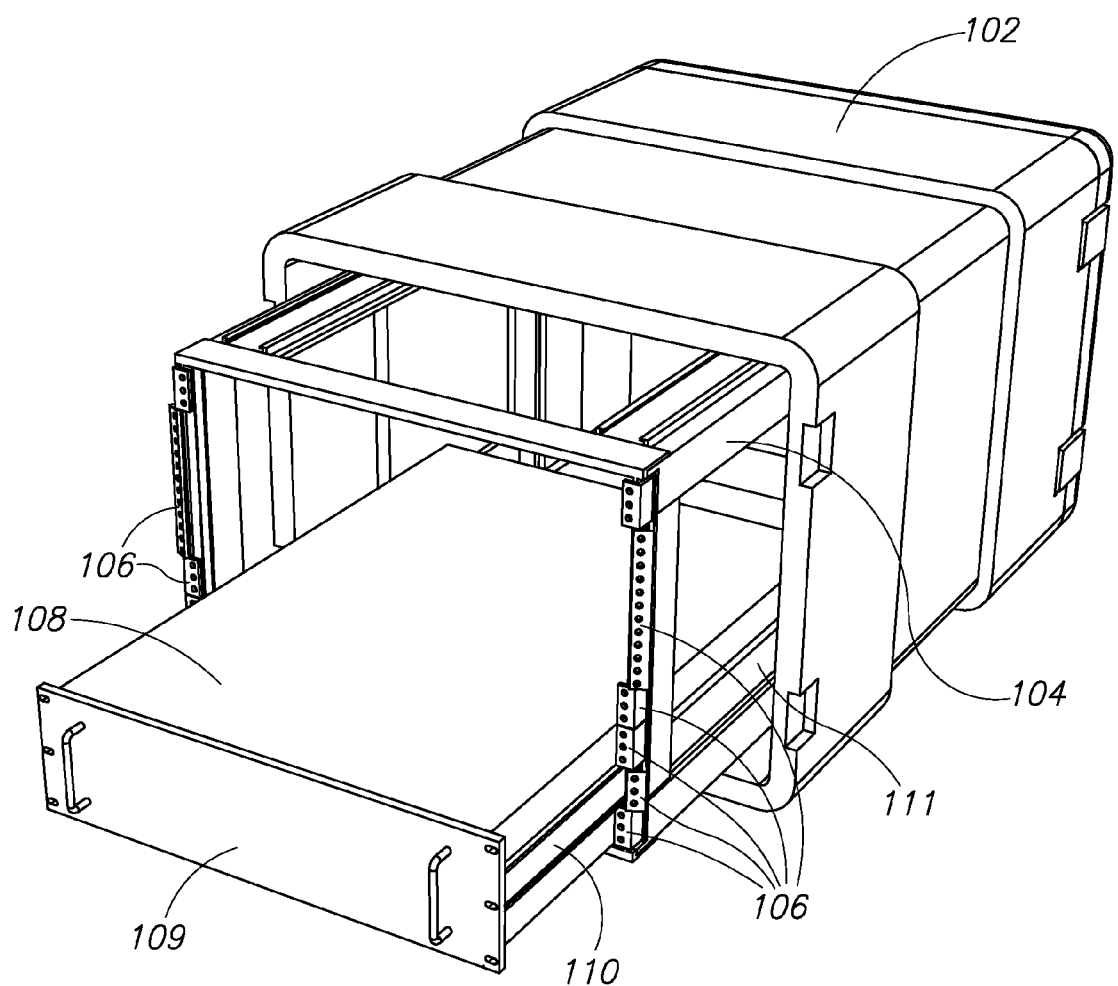
FIG. 1 shows a rack mount frame capable of mounting standard rack mountable electronic equipment.

FIG. 1 shows a rack mount case 102 capable of mounting full width electronic equipment 108. The standard rack mount case 102 is preferably formed compression molded with 40% continuous glass strand reinforced polypropylene sheet material. In alternate embodiments, other suitable materials may be used. The main body of the rack mount case 102 is stackable with other cases and has a front and rear cover. The front and rear covers preferably attach to the rack mount case 102 and facilitate a seal that may be used to preventingress of undesirable water, dust or even chemical agents. The rack mount case 102 covers are preferably equipped with a sufficient amount of latches to affect a seal. The rack mount case preferably also includes a pressure relief valve to equalize the internal and the external air pressure. The rack mount case 102 may be configured in a variety of shapes and sizes including, for example, unit 3-20 sizes.

A flip rail inner frame 104 provides a rigid framework structure that preferably meets the dimensional requirements of CEA-310 and is mounted using a shock mount system inside the rack mount case 102. The flip rail inner frame 104 is attached to an isolation system that is mounted inside the electronic enclosure and allows for the apparatus and equipment therein to be safely transported. The isolation system is comprised of a sufficient quantity of shock mounts to protect the enclosed equipment and the frame for safe transportation within the rack mount case. The shock mounts are preferably coupled between the frame and the case along both the top and bottom of the inner frame 104. In the preferred embodiment, the flip rail inner frame is 19.3 inches wide, has available depths of 20 inches, 24 inches, and 30 inches, and has a height of 5.25 inches to 35 inches. The equipment 108 is mounted within the rack mount inner frame 104 using a slide system 110. Further included on the rack mount inner frame 104 are vertical rails 106. The vertical rails 106 are rotatably coupled to the inner frame 104 such that they may rotated outward to allow for electronics 108 to be inserted within the inner frame 104.

Figure 2:
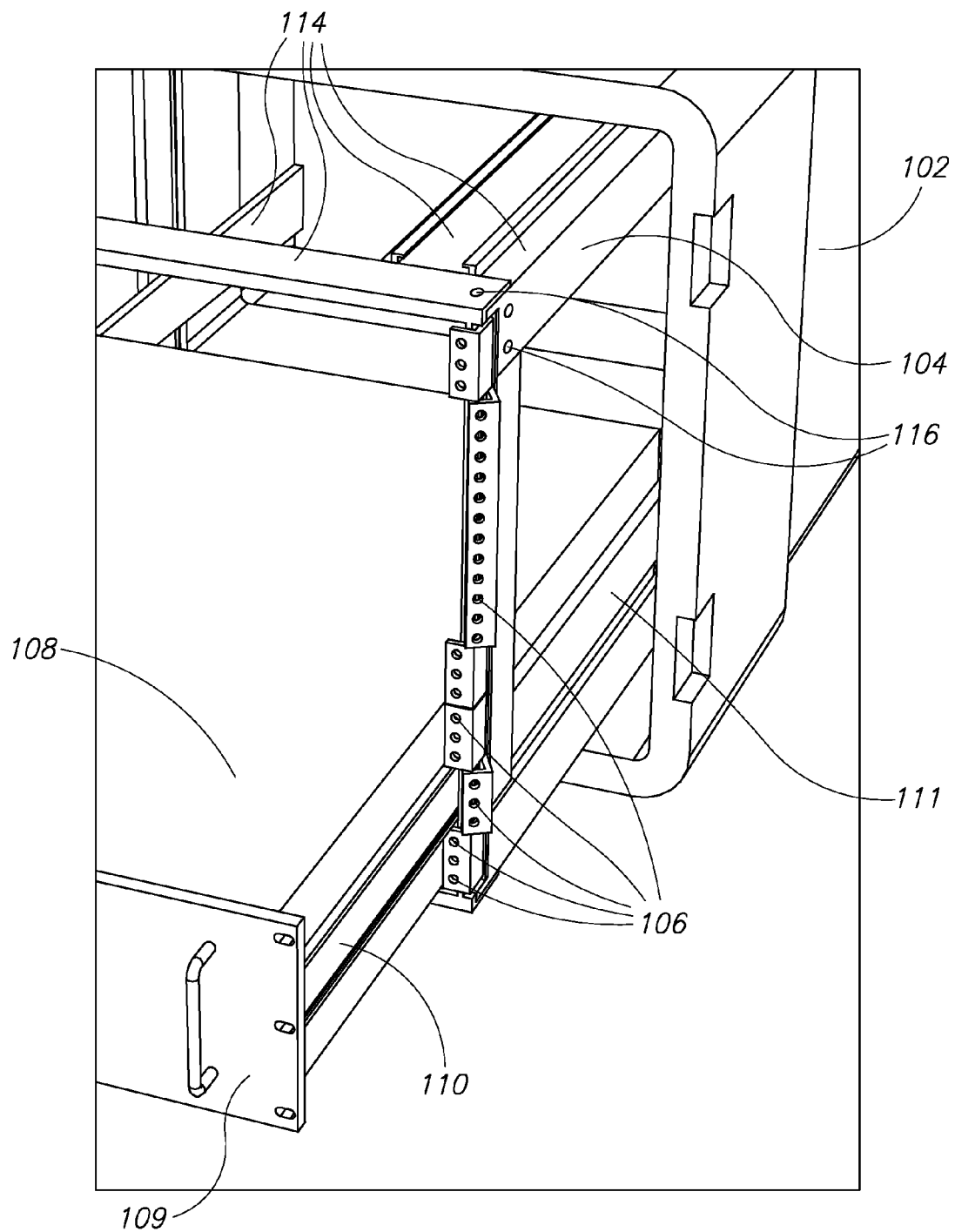
FIG. 2 shows a close-up view of a rack mount frame in a rack mount case capable of mounting standard rack mountable electronic equipment having rails.

FIG. 2 shows a close up view of a flip rail inner frame 104 in a rack mount case 102 capable of mounting full width electronic equipment 108. The electronic equipment 108 preferably includes a front plate 109 that extends outwardly past the inner frame 104 and includes slides 110. A female slide housing 111 is attached to the inner frame 104, while the slide 110 is attached to the electronic equipment 108. The interaction between the female housing 111 and the slide 110 allows for the electronic equipment 108 to be slideably mounted in the inner frame 104. In an alternate embodiment the electronic equipment 108 may be hard mounted to the inner frame 104. The inner frame 104 is preferably constructed using a variety of aluminum beams 114, but may be constructed out of any metal or polymer suitable for electronics mounting. The beams 114 are configured for mounting the electronic equipment 108. As shown the beams 114 are preferably assembled using rivets 116 to form the inner frame 104. The inner frame 104 comprising the beams 114 can also be welded, screwed or otherwise coupled together in alternate embodiments.

The apparatus preferably includes vertical rails 106 (see FIG. 3A) that are pivotally coupled to the inner frame 104 using a vertical rail retainer 122 (see FIG. 3B) affixed to the inner frame 104. Ideally the vertical rails 106 are formed through an extrusion process. The vertical rails 106 are preferably configured to pivot outwardly sufficient to allow equipment 108 to be inserted past the vertical rail 106 within the inner frame 104. The equipment 108 is slide mounted inboard from the vertical rails 106 such that the vertical rails 106 remain concealed by the front plate 109 of the equipment 108 until the equipment 108 is pulled out to the front of the inner frame 104. The inner frame 104 may be produced to conform to any height or depth. In a preferred embodiment, the inner frame 104 further allows for a plurality of equipment 108 to be rack mountable and is configured to be universal in accepting all rack mountable electronics 108.

Figure 3A:
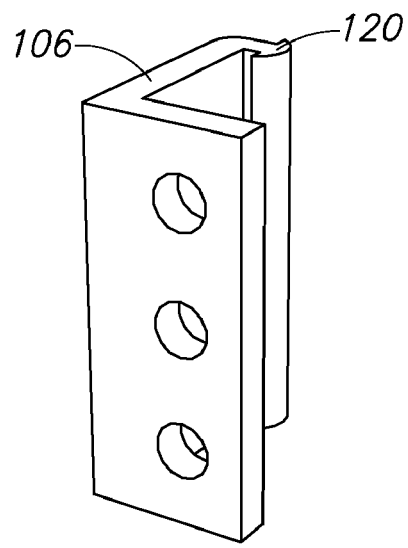
FIG. 3A shows a close-up view of a vertical rail and FIG. 3B shows a close-up view of a vertical rail retainer.
Figure 3B:
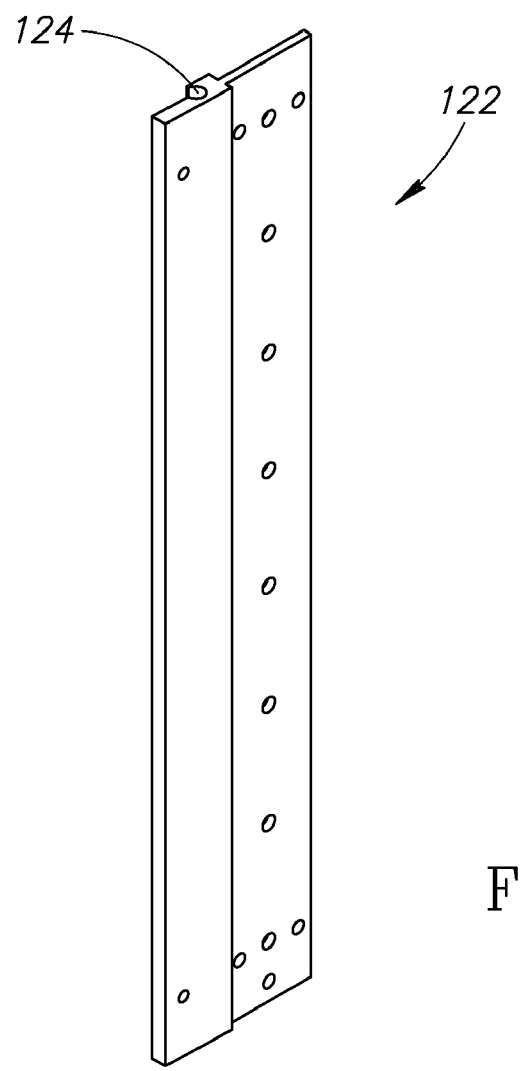

FIG. 3A shows a close-up view of a vertical rail 106 and FIG. 3B shows a close-up view of a vertical rail retainer 122. As shown with continuing reference to FIG. 2, the vertical rail 106 is preferably rotatably coupled to the inner frame 104 using the vertical rail retainer 122 of the rack mount case 102. The vertical rails 106 are configured to be rotatable outward to allow equipment with rails to be mounted in the rack mount case and thereafter closed to hold the equipment in place. The cylindrical boss 120 is configured to fit within the groove 124 of the vertical rail retainer 122 and allows for the vertical rail 106 and the vertical rail retainer 122 to hinge together. In one embodiment, the vertical rail 106 is capable of pivoting 25 degrees outward when mounted on the inner frame.

Figure 4:
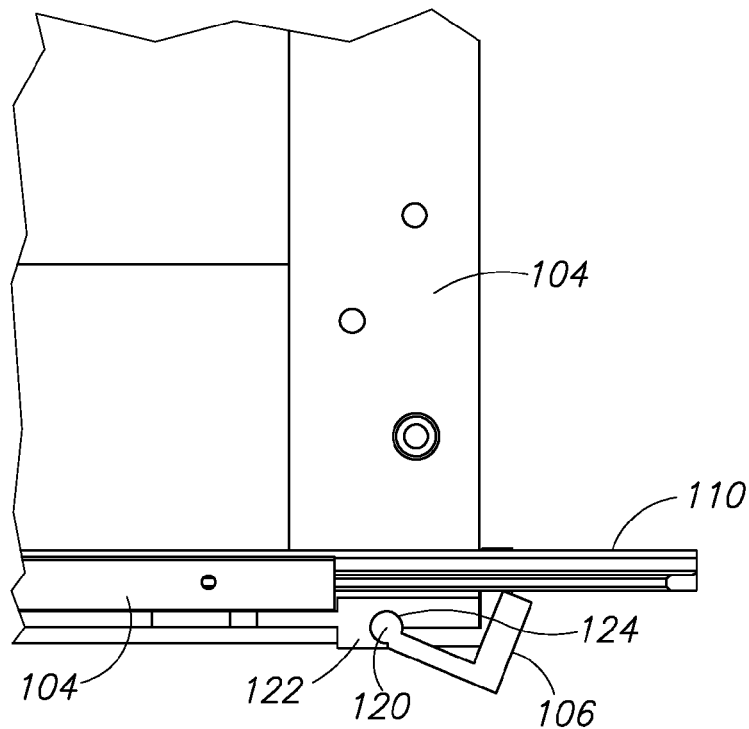
FIG. 4 shows a cross sectional view of the vertical rail retainer and the vertical rail.

FIG. 4 shows a cross sectional view of the vertical rail retainer 122 and the vertical rail 106. In this illustration, the slide 110 is positioned partially within the inner frame 104 and the vertical rail 106 is shown pivoted outwardly from the slide 110. When the slide 110 is positioned fully within the inner frame 104, the vertical rail 106 is operative to close and hold the slide 110 in place.

Figure 5:
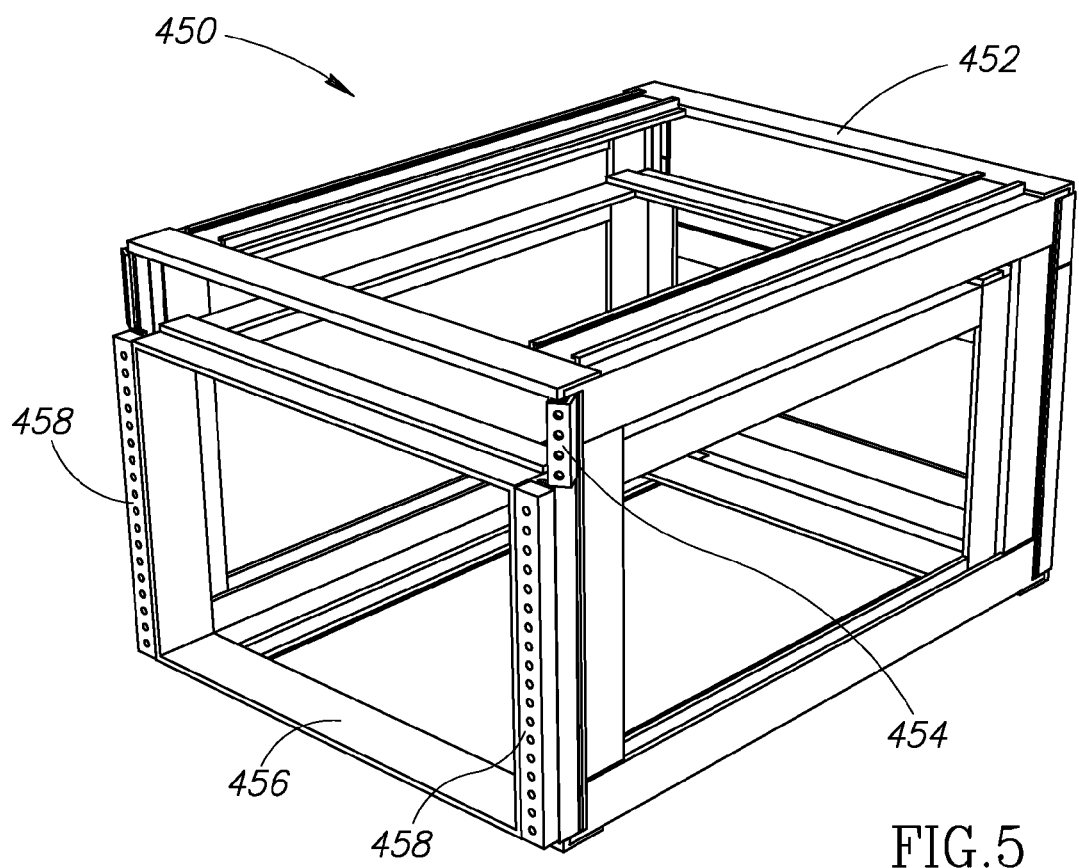
FIG. 5 shows an example rack in a rack mount apparatus.

FIG. 5 shows an alternate embodiment of an example rack mount apparatus 450. The rack mount apparatus 450 includes the plurality of structures as described above and further contains an outer frame 452 and an inner frame 456 configured to allow for pre-loading and mounting multiple pieces of electronic equipment (not shown). The electronic equipment may be integrated with the inner frame 456 using bolts, rivets, slide mounts or any other suitable coupling means. The inner frame 456 may be slide mounted into an outer frame 452 that is coupled to a transportable rack mount case (not shown) or a permanently fixed frame in a military structure (not shown). The inner frame 456 is preferably constructed using two front vertical mounting rails 458. These rails may be formed of various mounting surfaces of different degrees to allow the rails to interface with compatible flip rails 454 mounted to the front of the outer frame 452. The flip rails 454 hold the inner frame 456 within the outer frame 452. When oriented in an open configuration, the flip rails 454 allow for the inner frame 456 to be removed from the outer frame 452.

In one embodiment, the rack mount apparatus advantageously incorporates a series of framework structures that allow an efficient method of transporting an array of electronic equipment. This embodiment allows for field replacement of pre-assembled sets of equipment. The rack mount apparatus preferably provides full size CEA-310 racks that slide into a flip rail rack. In alternative embodiments, the rack mount apparatus can be configured for racks of any size. The rack mount apparatus frames are easily removable from the cases and can be reinstalled in a rigid rack in mobile or fixed shelters. The outer rack may be permanently mounted or slide mounted onto shock mounts in the center body of the case. The interior rack may occupy all or part of the rack space in the outer rack, thereby leaving rack space for accessories, drawers and other rack mountable equipment.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A flip rail apparatus for allowing electronic equipment to be slide mounted in a rack mount case, comprising:
   a rack mount frame coupled to the rack mount case, the rack mount frame configured to hold standard rack mountable electronic equipment within the rack mount case and having a first front vertical rail and a second front vertical rail;
   at least one first vertical flip rail rotatably attached directly to the first vertical rail; and
   at least one second vertical flip rail rotatably attached directly to the second vertical rail, the first and second vertical flip rails selectively rotate outward in order to allow electronic equipment to be removed,
   wherein the first and second vertical flip rails are attached to the respective vertical rails when the rack mount frame is not currently holding any rack mountable electronic equipment.

2. The apparatus of claim 1, wherein the electronic equipment has a first slide rail and a second slide rail.

3. The apparatus of claim 2, wherein the rack mount frame has a first rail housing and a second rail housing.

4. The apparatus of claim 3, wherein when the electronic equipment is installed in the rack mount frame, the first slide rail is slideably mounted in the first rail housing and the second slide rail is slideably mounted in the second rail housing.

5. The apparatus of claim 1, wherein the rack mount frame has an outer rack mount frame and an inner rack mount frame.

6. The apparatus of claim 5, wherein the inner rack mount frame is slideably mounted within the outer rack mount frame.

7. The apparatus of claim 6, wherein the inner rack mount frame is secured by at least one vertical flip rail.

8. The apparatus of claim 1, wherein the electronic equipment has a first slide rail and a second slide rail,
   wherein when the electronic equipment is installed in the rack mount frame,
      one of the first vertical flip rails is rotated away from the electronic equipment and a second one of the first vertical flip rails supports the first slide rail, and
      one of the second vertical flip rails is rotated away from the electronic equipment and a second one of the second vertical flip rails supports the second slide rail.

9. A method for allowing equipment to be slide mounted in a rack mount case, comprising:
   mounting a rack mount frame within the rack mount case such that the rack mount frame is configured to hold standard rack mountable electronic equipment;
   aligning a first rail rotatably attached directly to a first side of a rack mount frame with a second rail rotatably attached directly to a second side of a rack mount frame such the first rail is opposite to the second rail; and
   selectively securing electronics to the rack mount frame, the electronics slideably attached to the first and second rail, with a flip rail, such that when the flip rail is rotated outward the electronics can be removed.

10. The method of claim 9, wherein the electronic equipment has a first slide rail and a second slide rail.

11. The method of claim 10, wherein the rack mount frame has a first rail housing and a second rail housing.

12. The method of claim 11, wherein when the electronic equipment is installed in the rack mount frame, the first slide rail is slideably mounted in the first rail housing and the second slide rail is slideably mounted in the second rail housing.

13. The method of claim 9, wherein the rack mount frame has an outer rack mount frame and an inner rack mount frame.

14. The method of claim 13, wherein the inner rack mount frame is slideably mounted within the outer rack mount frame.

15. The method of claim 9, wherein the electronic equipment has a first slide rail and a second slide rail, wherein selectively securing comprises:
   rotating one of the first vertical flip rails away and one of the second vertical flip rails in a outward direction;
   sliding the electronic equipment into the rack mount frame such that a second one of the first vertical flip rails located below the rotated first vertical flip rail supports the first slide rail and a second one of the second vertical flip rails located below the rotated second vertical flip rail supports the second slide rail.

16. A flip rail apparatus for allowing electronic equipment to be slide mounted in a rack mount case, comprising:
   a rack mount frame coupled to the rack mount case, the rack mount frame configured to hold standard rack mountable electronic equipment within the rack mount case and having a first front vertical rail and a second front vertical rail;
   at least one first vertical flip rail rotatably attached directly to the first vertical rail; and
   at least one second vertical flip rail rotatably attached directly to the second vertical rail the first and second vertical flip rails rotate outward to allow the electronic equipment to be removed,
   wherein the first and second flip rails are attached to the respective vertical rails when the rack mount frame is not currently holding any rack mountable electronic equipment.

* * * * *